United States Patent
Baba et al.

(10) Patent No.: US 10,641,830 B2
(45) Date of Patent: May 5, 2020

(54) BATTERY'S STATE OF CHARGE ESTIMATION APPARATUS

(71) Applicants: Atsushi Baba, Saitama (JP); Shuichi Adachi, Kanagawa (JP)

(72) Inventors: Atsushi Baba, Saitama (JP); Shuichi Adachi, Kanagawa (JP)

(73) Assignees: Calsonic Kansei Corporation, Saitama (JP); Keio University, Tokyo (JP)

( * ) Notice: Subject to any disclaimer, the term of this patent is extended or adjusted under 35 U.S.C. 154(b) by 1328 days.

(21) Appl. No.: 14/400,160

(22) PCT Filed: Apr. 1, 2013

(86) PCT No.: PCT/JP2013/002265
§ 371 (c)(1),
(2) Date: Nov. 10, 2014

(87) PCT Pub. No.: WO2013/168349
PCT Pub. Date: Nov. 14, 2013

(65) Prior Publication Data
US 2015/0127280 A1    May 7, 2015

(30) Foreign Application Priority Data
May 11, 2012   (JP) ................................. 2012-109451

(51) Int. Cl.
*G01R 31/382* (2019.01)
*H01M 10/48* (2006.01)
(Continued)

(52) U.S. Cl.
CPC ......... *G01R 31/382* (2019.01); *G01R 31/367* (2019.01); *G01R 31/3648* (2013.01);
(Continued)

(58) Field of Classification Search
USPC .......................................................... 702/63
See application file for complete search history.

(56) References Cited

U.S. PATENT DOCUMENTS

| | | | |
|---|---|---|---|
| 2005/0046388 A1 | 3/2005 | Tate, Jr. et al. | |
| 2006/0111870 A1* | 5/2006 | Plett ................... | G01R 31/3651 |
| | | | 702/181 |
| 2011/0093233 A1 | 4/2011 | Quet | |

FOREIGN PATENT DOCUMENTS

| | | |
|---|---|---|
| CN | 1601295 A | 3/2005 |
| JP | 2009250970 A | 10/2009 |

(Continued)

OTHER PUBLICATIONS

Machine Translation JP 2011067088.*
(Continued)

*Primary Examiner* — Gregory J Toatley, Jr.
*Assistant Examiner* — Terence E Stifter, Jr.
(74) *Attorney, Agent, or Firm* — Pepper Hamilton LLP

(57) ABSTRACT

A battery's state of charge estimation apparatus will be provided.
The battery's state of charge estimation apparatus includes: a charge and discharge current detection unit; a terminal voltage detection unit; an open circuit voltage method state of charge estimation unit for estimating an open circuit voltage of the battery and an open circuit voltage method state of charge; a current integration method state of charge estimation unit for obtaining a current integration method state of charge as a state variable; and an error correction value calculation unit for calculating an error correction value for correcting the current integration method state of charge. The current integration method state of charge estimation unit corrects the current integration method state of charge by using the error correction value.

2 Claims, 9 Drawing Sheets

(51) Int. Cl.
   *G01R 31/3842*   (2019.01)
   *G01R 31/367*    (2019.01)
   *G01R 31/36*     (2020.01)
(52) U.S. Cl.
   CPC ........ *G01R 31/3842* (2019.01); *H01M 10/48* (2013.01); *H01M 2220/20* (2013.01)

(56) References Cited

FOREIGN PATENT DOCUMENTS

| JP | 2010203854 A | | 9/2010 |
|---|---|---|---|
| JP | 2011067088 A | * | 3/2011 |

OTHER PUBLICATIONS

Chinese Office Action dated Apr. 6, 2016 in corresponding Chinese App. No. 20138002601(4 pages).
Translation of International Search Report, PCT/JP2013/002265, dated Jun. 18, 2013 (2 pages).
Office Action from Japanese Patent Office in corresponding Japanese Application No. 2012-109451 dated Jun. 11, 2015 (4 pages).
Extended European Search Report from corresponding European Application No. 13788405.2 dated Jan. 4, 2016 (9 pages).

* cited by examiner

FIG. 1
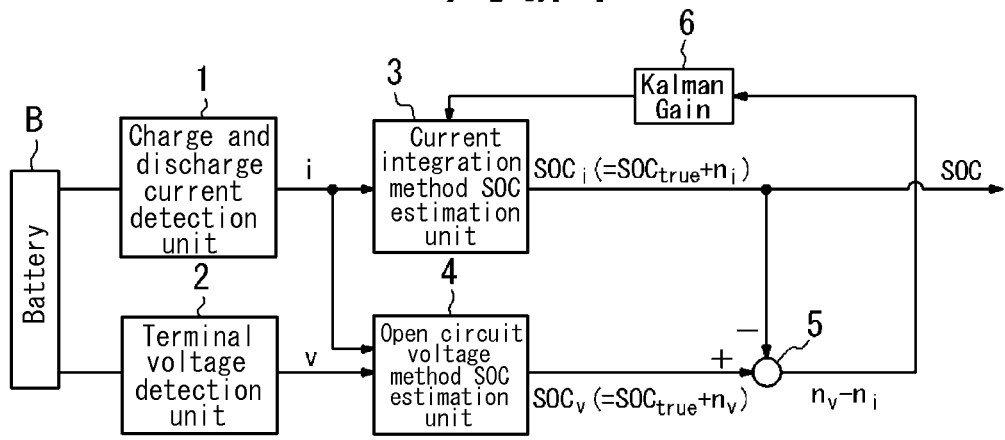
FIG. 2
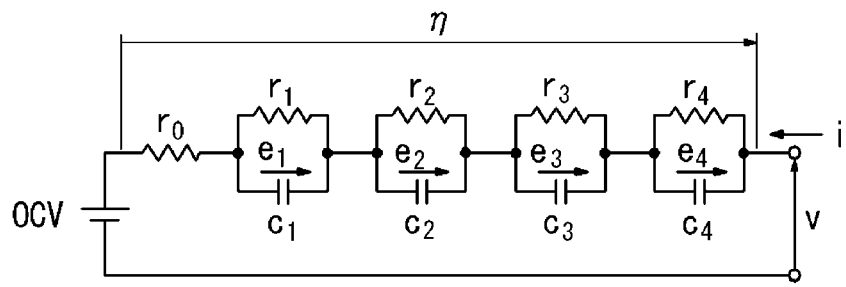
FIG. 3
| $r_0$ | 6.12mΩ | | |
|---|---|---|---|
| $r_1$ | 943μΩ | $c_1$ | 2.94kF |
| $r_2$ | 126μΩ | $c_2$ | 4.57kF |
| $r_3$ | 1.23mΩ | $c_3$ | 71.5kF |
| $r_4$ | 1.42mΩ | $c_4$ | 1.61MF |

Coulomb Counting

OCV Method with Kalman Filter

Sensor Fusion

Coulomb Counting

OCV Method with Kalman Filter

Sensor Fusion

Coulomb Counting

OCV Method with Kalman Filter

Sensor Fusion

Coulomb Counting

OCV Method with Kalman Filter

Sensor Fusion

Coulomb Counting

OCV Method with Kalman Filter

Sensor Fusion

FIG. 12

| Method | Nominal | Current Offset | | Initial OCV | | Voltage Offset | |
|---|---|---|---|---|---|---|---|
| | | +5A | −5A | +0.2V | −0.2V | +40mA | −40mA |
| Coulomb Counting | 0.0166 | 13.0 | 13.0 | 13.0 | 13.0 | 13.0 | 13.0 |
| OCV Method | 2.22 | 3.04 | 3.18 | 3.04 | 3.18 | 3.04 | 3.18 |
| Sensor Fusion | 0.224 | 0.941 | 1.08 | 0.941 | 1.08 | 0.941 | 1.08 |

BATTERY'S STATE OF CHARGE ESTIMATION APPARATUS

TECHNICAL FIELD

The present invention relates to a battery's state of charge estimation apparatus for estimating a battery's state of charge that is used for an electronic vehicle and the like.

BACKGROUND ART

In an electric vehicle and a hybrid electric vehicle, for example, in order to supply power to an electric motor for driving these vehicles, or in order to store electronic energy by charging power from the electric motor for using energy generated during braking as a generator or from a power source installed on the ground, a rechargeable battery (a secondary battery) is used.

In this case, in order to maintain an optimum battery status for a long time, it is necessary to monitor a battery status, a state of charge (SOC) in particular, at all times as battery management.

As conventional SOC detection methods, there are known a current integration method (also called as a Coulomb counting method or a book keeping method) and an open circuit voltage method. According to the current integration method, data about the voltage and the current of the battery therein/thereout are all recorded in a chronological order, and an electric charge at the present time is obtained by time integration of the current by using the data, and thus the SOC is obtained by using an initial value of the electric charge of the battery and a full charge capacity. According to the open circuit voltage method, an input current value and a terminal voltage value of the battery are input and, by using a battery equivalent circuit model, an open circuit voltage value serving as a model state quantity is sequentially estimated, thereby estimating the SOC from the open circuit voltage value.

There are advantages and disadvantages to each method. That is, the current integration method of the former, although being capable of estimating the SOC in a short time more accurately than the open circuit voltage method of the latter for estimating the SOC by using the open circuit voltage value, the current integration method requires monitoring at all times and, due to accumulation of errors over time, an accuracy deteriorates. On the other hand, although the open circuit voltage method of the latter does not require the monitoring at all times, due to a small fluctuation of the open circuit voltage associated with a change in the SOC, the open circuit voltage method is no better than the current integration method of the former in estimating a variation quantity of the SOC in a short time.

As such, there has conventionally known a method that, by correcting an estimation error of the SOC obtained by the above methods, attempts to improve the accuracy of the estimation of the SOC.

As one of conventional SOC estimating apparatuses employing such a method, there is known a SOC estimation apparatus including: a first electrical quantity calculating means for calculating a SOC from an open circuit voltage estimation value estimated by employing the open circuit voltage method using an adaptive digital filter based on a discharge current and a terminal voltage of the battery; a second electrical quantity calculating means for carrying out time integration of a charge current and the discharge current of the battery by employing the current integration method and, based on thus obtained integrated value, calculating a changing quantity of the electricity charged in the battery; and an offset quantity estimating means for estimating, from a difference between the changing quantities obtained by the first electrical quantity calculating means and the second electrical quantity calculating means, an offset quantity serving as a measured value error of a discharge current measuring instrument, wherein correction for the offset quantity is carried out to reduce the measured value error of the discharge current measuring instrument and to improve the accuracy of a measured current value, thereby improving the accuracy of the estimation of an internal state of the battery such as the SOC (for example, see Patent Document 1).

Also, as another conventional SOC estimation method, there is known a method including: a battery information obtainment step of measuring battery information (the current value, a voltage value, and temperature); a current correction step of calculating a current integrated value by carrying out integration of a corrected current value corrected by using the voltage value; an integrated capacity calculation step of calculating a current integrated value by carrying out integration of the corrected current value and also calculating a current integrated capacity reflecting the current integrated value and a battery charge and discharge efficiency; a correction determination step of determining, based on a battery forward voltage capacity calculated from the battery information, whether to correct the current integrated capacity; and an integration correction step of obtaining a remaining capacity of the battery with or without correcting the current integrated capacity according to the determination, thereby attempting to improve accuracy of the calculation of the SOC by correcting a measurement error of the battery information (for example, see Patent Document 2).

RELATED ART DOCUMENTS

Patent Documents

Patent Document 1: Japanese Patent Application Laid-Open Publication No. 2010-203854
Patent Document 2: Japanese Patent Application Laid-Open Publication No. 2009-250970

SUMMARY OF INVENTION

Technical Problem

However, both of the inventions described above have the following problems.

That is, the conventional SOC estimation apparatus of the former compares between a changing quantity of electricity estimated by the current integration method and the changing quantity of electricity estimated by the open circuit voltage method using an adaptive digital filter and, from a difference therebetween, estimates an error value of the current detection unit (an offset quantity of the measured current value).

However, since each of the estimated values of the quantities of electricity and the like obtained by the above methods have different statistical characteristics, a simple comparison between the changing quantities of the electricity obtained by the above methods cannot avoid an error caused by such statistical characteristics. Therefore, an error of a measured value of the discharge current measuring instrument may not be estimated with high accuracy. Also, there is a fluctuation of the current within the battery due to uncertainty of chemical reaction therein. As a result, there is another problem that the accuracy of the estimation of the SOC is also lowered.

Also, in the conventional SOC estimation method of the latter, the characteristics of the discharge current measuring instrument changes according to time, condition and environment during the use and, further, variations between each discharge current measuring instrument cannot be avoided. Nonetheless, this conventional method estimates as described above assuming that all of the discharge current measuring instruments have identical characteristics. Therefore, this conventional method cannot handle an error of the measured value caused by a difference from actual characteristics of the discharge current measuring instrument, and thus is incapable of estimating the error of the measured value of the discharge current measuring instrument with high accuracy. Further, there is the fluctuation of the current within the battery due to the uncertainty of the chemical reaction therein. As a result, there is a problem that this conventional method also has a difficulty in estimating the SOC with high accuracy.

The present invention in view of the above problems aims to provide a SOC estimation apparatus that, regardless of the changes and variations caused by the characteristics of the charge and discharge current detection unit and the fluctuation of the current within the battery, is capable of estimating the SOC with high accuracy.

Solution to Problem

In order to achieve the above object, a battery's state of charge estimation apparatus according to claim 1 of the present invention includes:

a charge and discharge current detection unit for detecting a charge current and a discharge current of a battery;

a terminal voltage detection unit for detecting a terminal voltage of the battery;

an open circuit voltage method state of charge estimation unit for estimating an open circuit voltage of the battery based on the charge current and the discharge current detected by the charge and discharge current detection unit and the terminal voltage detected by the terminal voltage detection unit, and estimating, based on the open circuit voltage, an open circuit voltage method state of charge from an open circuit voltage-state of charge characteristic of the battery;

a current integration method state of charge estimation unit, by using, in a current integration model, a current in consideration of fluctuation as an input and the open circuit voltage method state of charge and the charge current and the discharge current obtained as observed amounts as outputs, for obtaining a current integration method state of charge as a state variable; and an error correction value calculation unit, by comparing between the current integration method state of charge obtained by the current integration method state of charge estimation unit and the open circuit voltage method state of charge estimated by the open circuit voltage method state of charge estimation unit, for calculating an error correction value for correcting the current integration method state of charge, wherein the current integration method state of charge estimation unit corrects the current integration method state of charge by using the error correction value calculated by the error correction value calculation unit.

A battery's state of charge estimation apparatus according to claim 2 is the state of charge estimation apparatus according to claim 1, wherein the error correction value calculation unit has Kalman filter and, by multiplying a difference between the current integration method state of charge and the open circuit voltage method state of charge by Kalman gain, obtains the error correction value.

Effect of the Invention

The SOC estimation apparatus according to claim 1, regardless of changes and variations caused by characteristics of the charge and discharge current detection unit and a fluctuation of the current within the battery, is capable of estimating the SOC with high accuracy.

The SOC estimation apparatus according to claim 2, by using the Kalman filter, is capable of easily correcting the current integration method SOC.

BRIEF DESCRIPTION OF DRAWINGS

FIG. 1 is a block diagram illustrating a configuration of a SOC estimation apparatus according to one embodiment of the present invention;

FIG. 2 is a diagram illustrating a battery equivalent circuit model used by the SOC estimation apparatus according to one embodiment;

FIG. 3 is a diagram illustrating a table that, in a simulation of the SOC estimation apparatus according to one embodiment, summarizes values of a resistor and a capacitor of the battery equivalent circuit model of FIG. 2;

FIG. 12 is a diagram illustrating a comparison of simulation results obtained by the methods of estimation.

DESCRIPTION OF EMBODIMENT

Figure 4:
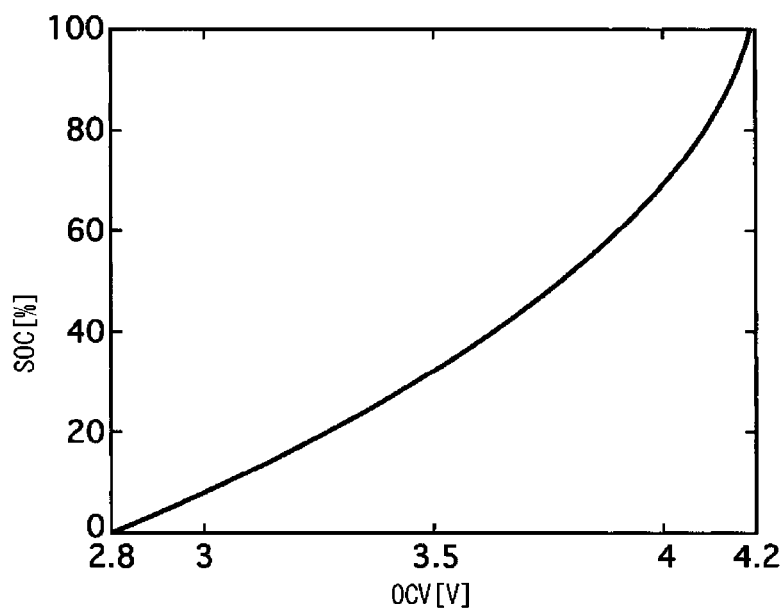
FIG. 4 is a diagram illustrating an open circuit voltage-SOC characteristic of the battery equivalent circuit model of FIG. 2.

Hereinafter, an embodiment of the present invention will be described in detail based on an example illustrated in the accompanying drawings.

A SOC estimation apparatus according to the present embodiment is mounted in a hybrid vehicle (HEV: Hybrid Electric Vehicle) having an internal combustion engine and an electric motor for driving. The SOC estimation apparatus is connected to a battery that supplies power for operating the electric motor for driving and an electronic device and estimates a SOC.

First, an entire configuration of the SOC estimation apparatus according to the present embodiment will be described with reference to FIG. 1.

As illustrated in the figure, the SOC estimation apparatus connected to a battery B includes a charge and discharge current detection unit 1, a terminal voltage detection unit 2, a current integration method SOC estimation unit (a current integration method SOC estimation unit) 3, an open circuit voltage method SOC estimation unit (an open circuit voltage method SOC estimation unit) 4, a subtraction unit 5, and a Kalman filter (Kalman gain) 6.

The battery B is a rechargeable battery and, according to the present embodiment, may be a lithium ion battery, for example. Note that according to the present embodiment, as a matter of course, the battery B does not need to be the lithium ion battery but may be of another type such as a nickel-metal hydride battery and the like.

The charge and discharge current detection unit 1 detects a magnitude of a discharge current i when the power is supplied to an electric motor or the like (not shown) from the battery B. The charge and discharge current detection unit 1 also detects the magnitude of a charge current i when the electric motor is made to function as a generator during braking and a portion of braking energy is collected by the battery B, or when the battery B is charged from a power supply equipment installed on the ground. The charge and discharge current detection unit 1, by using, for example, a shunt resistor or the like, detects the charge and discharge current i flowing inside the battery B.

The charge and discharge current i that is detected is input, as an input signal, to both the current integration method SOC estimation unit 3 and the open circuit voltage method SOC estimation unit 4.

Note that, the charge and discharge current detection unit 1 of any type having various configurations may be appropriately employed.

The terminal voltage detection unit 2 detects the voltage between terminals of the battery B. A terminal voltage v detected by the terminal voltage detection unit 2 is input to the open circuit voltage method SOC estimation unit 4.

The terminal voltage detection unit 2 of any type having various configurations may be appropriately employed.

To the current integration method SOC estimation unit 3, the charge and discharge current i detected by the charge and discharge current detection unit 1 and an error correction value obtained by the Kalman filter 6 are input. The current integration method SOC estimation unit 3 uses a current taking the fluctuation into account in a current integration model as an input and thus obtains the current integration method SOC serving as a state variable. Also, the current integration method SOC estimating section 3 corrects the current integration method SOC based on the error correction value and thus obtains a current integration method state of charge SOCi.

Here, the current integration method state of charge $SOC_i$ is a value including a true state of charge $SOC_{true}$ having an error $n_i$ added thereon.

The current integration method state of charge $SOC_i$ is input to the subtracting unit 5.

Note that the above processing and calculation carried out by the current integration method SOC estimation unit 3 will be described in detail below.

The open circuit voltage method SOC estimation unit 4, based on the charge and discharge current i obtained from the charge and discharge current detection unit 1 and the terminal voltage v obtained from the terminal voltage detection unit 2, by using the Kalman filter (not illustrated) with a battery equivalent circuit model of the battery B illustrated in FIG. 2, estimates an open circuit voltage OCV (Open Circuit Voltage) of the battery B.

The open circuit voltage method SOC estimation unit 4 stores relationship data: open circuit voltage of the battery B [V]–SOC [%], which is preliminarily obtained in an experiment and illustrated in FIG. 4 and, by using the relationship data, obtains an open circuit voltage method state of charge $SOC_v$ that is corresponding to the open circuit voltage OCV that is estimated. Note that the open circuit voltage method state of charge $SOC_v$ is a value including the true state of charge $SOC_{true}$ of the battery B having noise $n_v$ added thereon.

The open circuit voltage method state of charge $SOC_v$ is input to the subtraction unit 5.

In the Kalman filter of the open circuit voltage method SOC estimation unit 4, to the battery equivalent circuit model of the battery B, an input the same as that to the actual battery B (such as charge and discharge current and battery temperature) is input. Then, the Kalman filter compares between outputs (terminal voltages) of the battery equivalent circuit model and the actual battery B. When there is a difference therebetween, the Kalman filter performs feedback by multiplying the difference by Kalman gain and corrects the values of a resistor and a capacitor forming the battery equivalent circuit model such that an error is minimized Through sequential repetition of this processing, the open circuit voltage OCV indicating a true internal state quantity is estimated.

On the other hand, the battery equivalent circuit model illustrated in FIG. 2 according to the present embodiment employs a Foster-type RC ladder circuit.

This circuit is made up of four parallel circuits connected in series to a resistance $r_0$ for setting DC components such as an electrolyte resistance of the battery B and an ohmic resistance of a connection, and the four parallel circuits include two parallel circuits representing fast response and respectively including charge transfer resistances $r_1$ and $r_2$ and capacitors $c_1$ and $c_2$, and two parallel circuits representing slow response and respectively including diffusion process resistances $r_3$ and $r_4$ and capacitors $c_3$ and $c_4$.

As illustrated in FIG. 2, in the above circuit the parallel circuits respectively include a voltage $e_1$, a voltage $e_2$, a voltage $e_3$, and a voltage $e_4$. The terminal voltage v is obtained by adding an overvoltage $\eta(=r_0 \times i + e_1 + e_2 + e_3 + e_4)$ to the open circuit voltage OCV.

The subtraction unit 5 subtracts, from the open circuit voltage method state of charge SOC, obtained by the open circuit voltage method SOC estimation unit 4, the current integration method state of charge $SOC_i$ obtained by the current integration method SOC estimation unit 3, and thus obtains a difference between the errors $(n_v - n_i)$.

This difference between the errors is input to the Kalman filter 6.

Kalman filter 6 multiplies a difference between the errors $(n_v - n_i)$ input from the subtraction unit 5 by the Kalman gain, and thus calculates the error correction value. Then, the Kalman filter 6 inputs the error correction value to the current integration method SOC estimation unit 3.

Note that the Kalman filter 6 performs feedback by adjusting the Kalman gain in such a manner that the error $n_i$ of the current integration method state of charge $SOC_i$ becomes zero.

Also, the subtraction unit 5 and the Kalman filter 6 correspond to an error correction value calculation unit of the present invention.

Next, the processing carried out by the current integration method SOC estimation section 3 will be described below.

Here, correction of the calculation of the current integration method by using the state of charge SOC, estimated by the open circuit voltage method allows a simple configuration overall. A Kalman filter model that achieves such a configuration will be considered.

First, a current integration model such as Equation (1):

$$SOC_{k+1} = SOC_k + \frac{\Delta t}{FCC} i_k \quad (1)$$

is considered.

Here, SOC, i, FCC, and $\Delta t$ represent the SOC, the charge and discharge current, a full charge capacity, and a sampling period, respectively. Also, an index k represents discrete time.

In the foregoing Equation (1), a state variable x, an input u, and an output y are defined as follows:

[Equation 2]

$$x = SOC \quad (2)$$

$$u = i \quad (3)$$

$$y = [SOC \, i]^T \quad (4)$$

In the above equation, in particular, the output is separated into the state of charge SOC and the charge and discharge current i.

That is, both the state of charge SOC estimated by the open circuit voltage method and the charge and discharge current i detected by the charge and discharge current detection unit 1 are considered as observed quantities respectively having regular white sensor noise added thereon.

At this time, a discrete time state space model, providing that v and w represent process noise and sensor noise, respectively, is expressed by the following equation:

$$x_{k+1} = x_k + \frac{\Delta t}{FCC} u_k + v_k \quad (5)$$

$$y_k = \begin{bmatrix} 1 \\ 0 \end{bmatrix} x + \begin{bmatrix} 0 \\ 1 \end{bmatrix} u_k + w_k \quad (6)$$

Here, the state variable x and the input u represent the SOC and the charge and discharge current, respectively.

Next, in order to consider the process noise associated with the current, this model is converted into a spreading system.

That is, provided that the state variable z of the spreading system is expressed by the following equation:

$$z = \begin{bmatrix} x \\ u \end{bmatrix} \quad (7)$$

the discrete time state space model of the spreading system is expressed by the following equation:

$$z_{k+1} = \begin{bmatrix} 1 & \frac{\Delta t}{FCC} \\ 0 & 1 \end{bmatrix} z_k + \begin{bmatrix} v_k \\ \zeta_k \end{bmatrix} \quad (8)$$

$$y_k = \begin{bmatrix} 1 & 0 \\ 0 & 1 \end{bmatrix} z_k + w_k \quad (9)$$

Note that $\zeta$ represents the process noise associated with the current, i.e. a fluctuation of the current.

Application of the Kalman filter to the model including the fluctuation of the current in addition allows better estimation of the SOC.

Here, to describe the meaning of the process noise $\zeta$ associated with the current, a current flowing outside the battery and a current flowing inside the battery are not necessarily equal to each other.

Since complex electrochemical reaction is taken place in the battery and the current is biased locally within the battery, it is considered that there is apparent generation and disappearance of the charge.

Although it is difficult to express such a phenomenon by using a model, in this case it may be considered that, for example, the current flowing inside the battery is considered as one of the state variables having regular whiteness process noise (an average value: 0) added thereon.

That is, it may be formulated as the following equation:

[Equation 6]

$$i_{k+1} = i_k + \zeta_k \quad (10)$$

Since the current flowing inside the battery and the electrochemical reaction are closely related to each other, it fits reality to assume that there is process noise as expressed by Equation (8), rather than having the current as an input as expressed by Equation (5) and assuming that the process noise has no influence on the system.

Note that in actual design the process noise of the current will be determined as an adjustment parameter through trial and error.

Next, results of simulations for confirming the validity of the SOC estimating apparatus of the above embodiment will be described.

First, the simulations used a charge and discharge current and a terminal voltage obtained by inputting, to a battery model simulating a HEV battery with a full charge capacity of 6.5 Ah, a waveform of an actual driving current of the HEV.

Here, the battery model simulating the HEV battery is the equivalent circuit model illustrated in FIG. 2 having the value illustrated in FIG. 3 and also having the open circuit voltage-SOC characteristic illustrated in FIG. 4.

Noted that the unit Ah of the full charge capacity is a unit of the electric charge quantity and satisfies the following equation: 1 Ah=3600 C (Coulomb).

Figure 5:
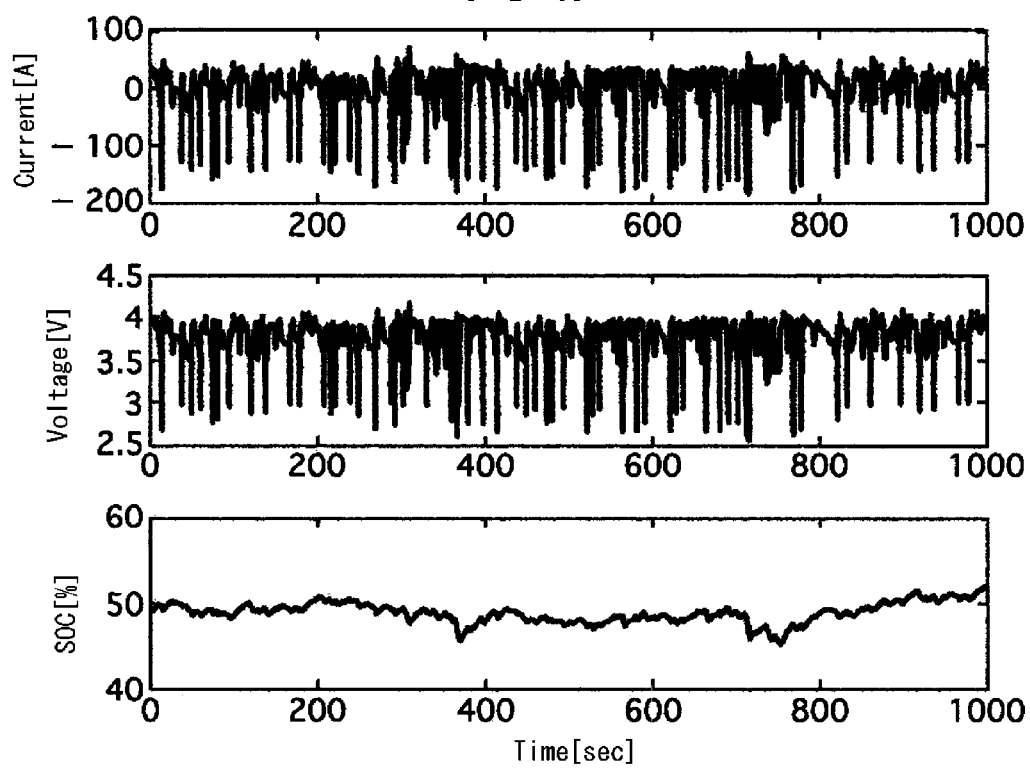
FIG. 5 is a diagram illustrating a waveform of charge and discharge voltages, a waveform of a terminal voltage, and a waveform of a true value of a SOC.

The waveform of the charge and discharge current, the waveform of the terminal voltage, and the waveform of a true value of the SOC are illustrated in FIG. 5. In the figure, a horizontal axis represents time [sec], the charge and discharge current [A] is indicated at the top, the terminal voltage [V] is indicated in the middle, and the true value of the SOC [%] is indicated at the bottom. These waveforms are formed when the HEV runs through a traffic jam mainly in an urban area while frequently accelerating and decelerating.

Note that the HEV is characteristic in such a way that the SOC thereof by the internal combustion engine in addition to the charging by charging regenerative braking is controlled to be around 50%, which greatly differs from an EV that is charged by the regenerative braking alone during running.

In this simulations, the following three estimation methods are compared to one another. That is,
(a) Current integration method,
(b) Open circuit voltage method using the Kalman filter, and
(c) What is called a sensor fusion method using a combination of the above two methods of the present invention, i.e., the present embodiment are compared to one another.

Further, seven conditions described below are given. Condition 1 assumes an ideal condition, and all of the other conditions assume the worst values.
<Condition 1> There is no quantization error or other errors other than the sensor noise.
<Condition 2> The current sensor (the charge and discharge current detection unit) has an offset error of +5 A.
<Condition 3> The current sensor has the offset error of −5 A.
<Condition 4> The open circuit voltage has an initial value error of +0.2 V.
<Condition 5> The open circuit voltage has the initial value error of −0.2 V.
<Condition 6> The voltage sensor (the terminal voltage detection unit) has an offset error of +40 mV.
<Condition 7> The voltage sensor has the offset error of −40 mV.

Further, processing conforming to an actual HEV/EV sensor such as the quantization error and the sensor noise is added to the waveforms of the currents and the terminal voltage. For example, the current sensor is applied with the noise of an average value of 0 A and a variance of 0.5 A and quantized with a quantization width of 0.7 A. Also, the voltage sensor is applied with the noise of the average value of 0 V and the variance of 20 mV and quantized with the quantization width of 20 mV. A sampling period was set to 0.1 second.

Furthermore, four items are set: a variance Q of the process noise of the Kalman filter, a variance r of the sensor noise, an initial value of the estimated value of the state variable, and a covariance $P_0$.

Settings of the Kalman filter used by the open circuit voltage method are as follows:

[Equation 7]

$$Q = \text{diag}(0.1, 10^{-7}, 10^{-7}, 10^{-13}) \quad (11)$$

$$r = 3 \cdot 10^{-3} \quad (12)$$

$$P_0 = 10^5 I_{4 \times 4} \quad (13)$$

$$\hat{x}_0 = [0.996, 1 \cdot 10^{-3}, -1.2 \cdot 10^{-2}, 6.1 \cdot 10^{-3}]^T \quad (14)$$

Next, settings of the Kalman filter used by the sensor fusion method are as follows:

[Equation 8]

$$Q = \text{diag}(10^{-5}, 10^{-5}) \quad (15)$$

$$r = 3 \cdot 10^{-2} \quad (16)$$

$$P_0 = 10^5 I_{2 \times 2} \quad (17)$$

$$\hat{x}_0 = [SOC_{initial}, 0]^T \quad (18)$$

Note that $SOC_{initial}$ represents an initial value of a measured SOC. Accordingly, under the conditions 4 to 7, for example, a value including an error is given as the initial value.

Based on results of the simulations, the results of the estimation methods are compared as described below.

Figure 6A:
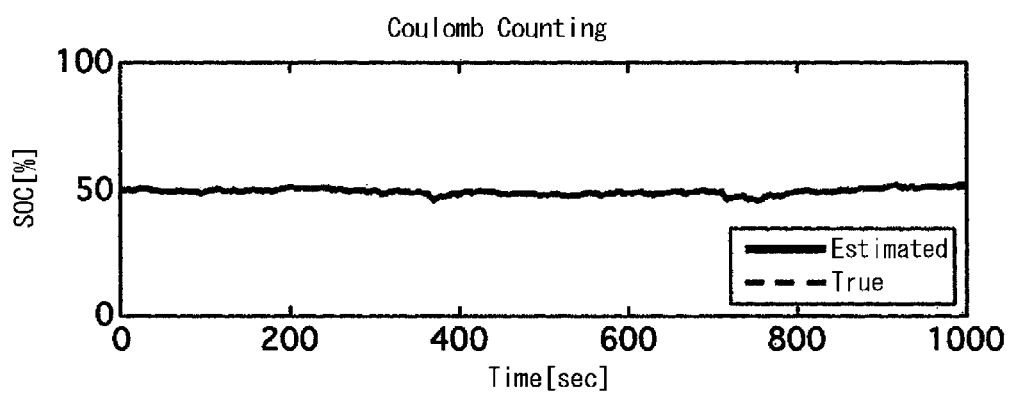
FIG. 6A is a diagram illustrating, in a simulation under a condition 1, a SOC estimated by a current integration method.
Figure 6B:
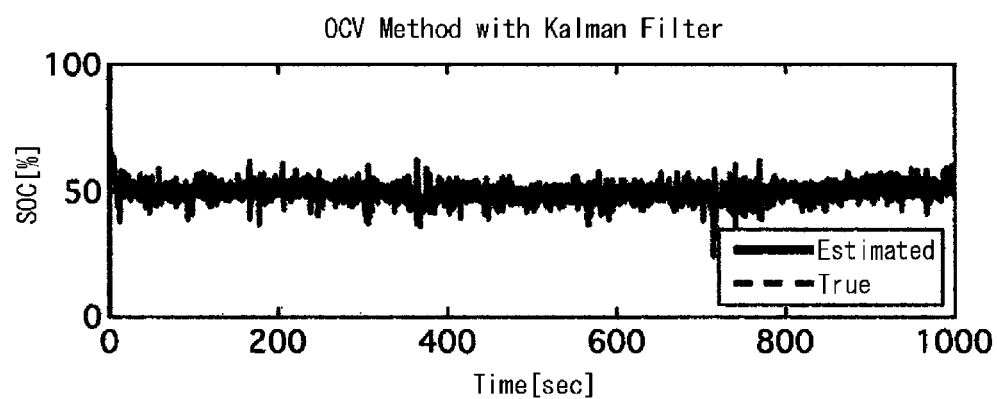
FIG. 6B is a diagram illustrating, in the simulation under the condition 1, a SOC estimated by an open circuit voltage method.
Figure 6C:
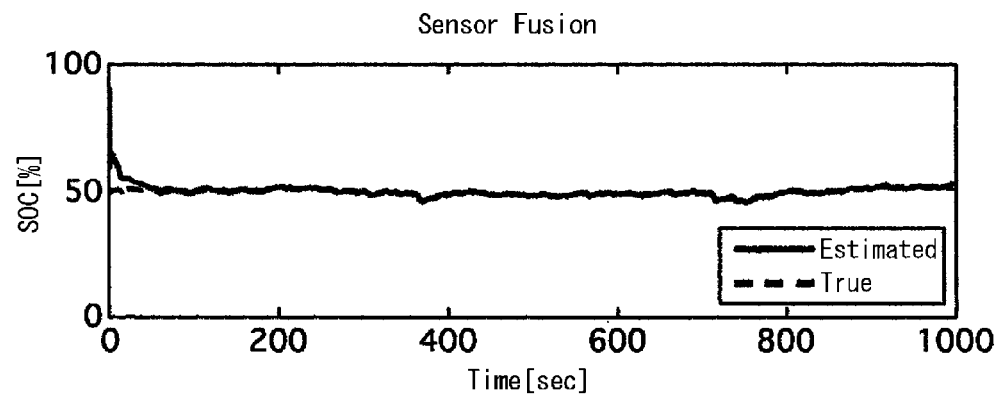
FIG. 6C is a diagram illustrating, in the simulation under the condition 1, a SOC estimated by a sensor fusion method.
Figure 7A:
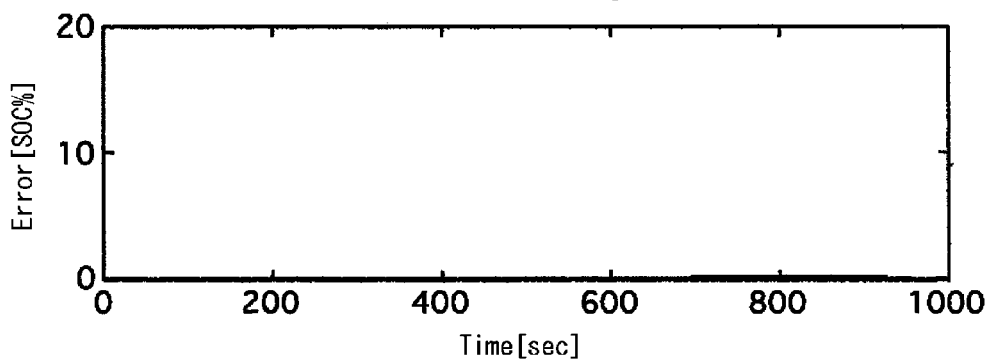
FIG. 7A is a diagram illustrating, in the simulation under the condition 1, an error caused by the estimation using the current integration method.
Figure 7B:
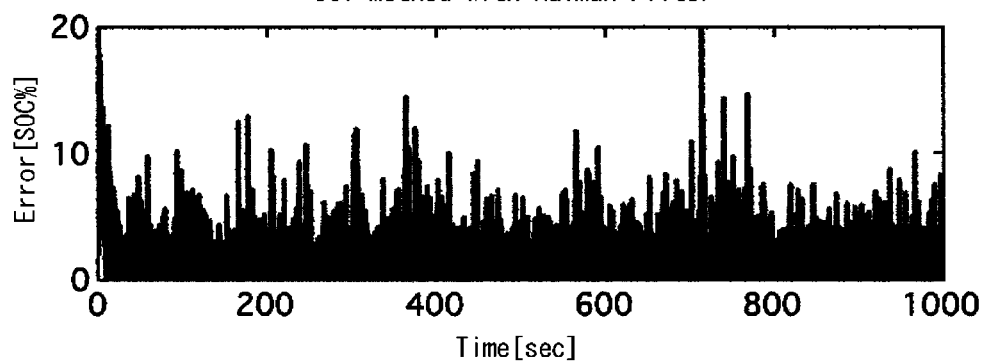
FIG. 7B is a diagram illustrating, in the simulation under the condition 1, an error caused by the estimation using the open circuit voltage method.
Figure 7C:
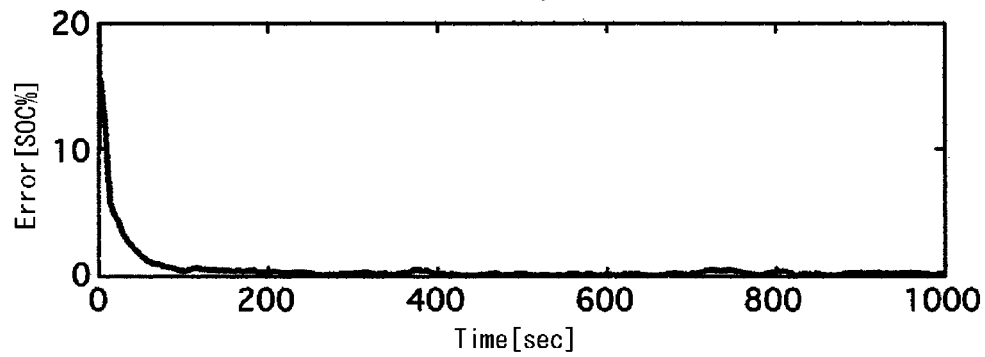
FIG. 7C is a diagram illustrating, in the simulation under the condition 1, an error caused by the estimation using the sensor fusion method.

Results of the estimation of the SOC of the simulation under the condition 1 are illustrated in FIGS. 6A to 6C, and absolute values of errors thereof are respectively illustrated in FIGS. 7A to 7C.

Note that horizontal axes in FIGS. 6A to 6C represent the time [sec], a vertical axis in FIG. 6A represents the SOC [%] estimated by the current integration method, a vertical axis in FIG. 6B represents the SOC [%] estimated by the open circuit voltage method using the Kalman filter, and a vertical axis in FIG. 6C represents the SOC estimated by the sensor fusion method. In FIGS. 6A to 6C, solid lines and dashed lines represent the estimated values and the true values, respectively. Note that in FIGS. 6A to 6C a portion where the value indicated by the solid line and the value indicated by the dashed line are the same or very close to one another, the dashed line overlaps the solid line and thus id concealed. The same is true for FIG. 8 to FIG. 10 described below.

Also, horizontal axes in FIGS. 7A to 7C represent the time [sec], a vertical axis in FIG. 7A represents an error [%] of the SOC estimated by the current integration method, a vertical axis in FIG. 7B represents an error [%] of the SOC estimated by the open circuit voltage method using the Kalman filter, and a vertical axis in FIG. 7C represents an error [%] of the SOC estimated by the sensor fusion method.

In this case, it can be seen that the SOCs estimated by the sensor fusion method substantially converge on the true value.

Figure 8A:
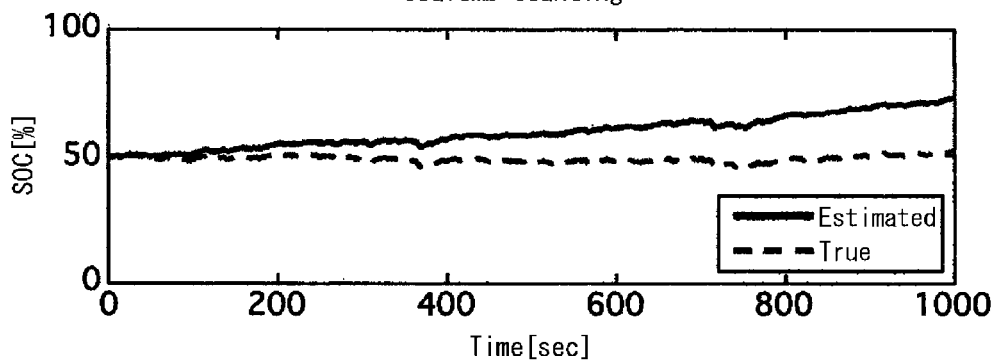
FIG. 8A is a diagram illustrating, in a simulation under a condition 2, a SOC estimated by the current integration method.
Figure 8B:
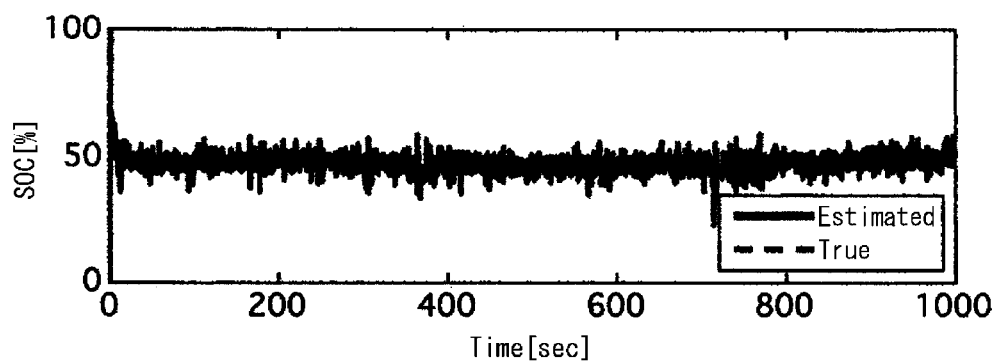
FIG. 8B is a diagram illustrating, in the simulation under the condition 2, a SOC estimated by the open circuit voltage method.
Figure 8C:
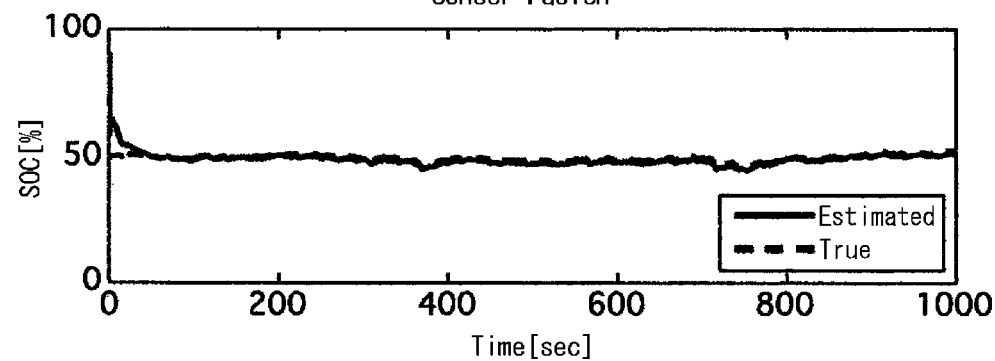
FIG. 8C is a diagram illustrating, in the simulation under the condition 2, a SOC estimated by the sensor fusion method.
Figure 9A:
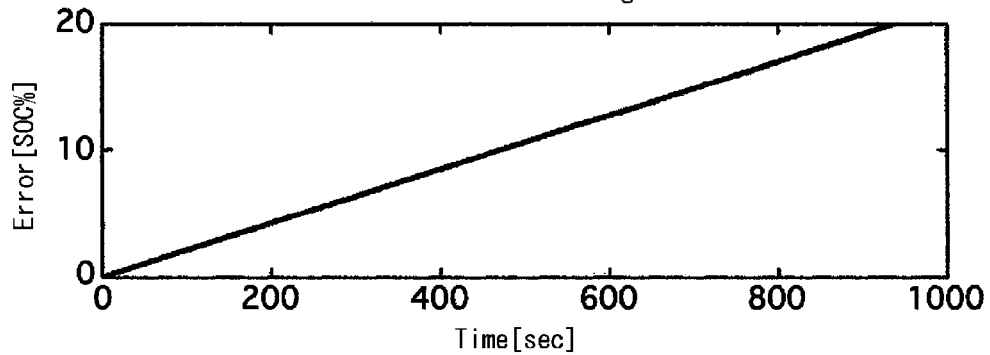
FIG. 9A is a diagram illustrating, in the simulation under the condition 2, an error caused by the estimation using the current integration method.
Figure 9B:
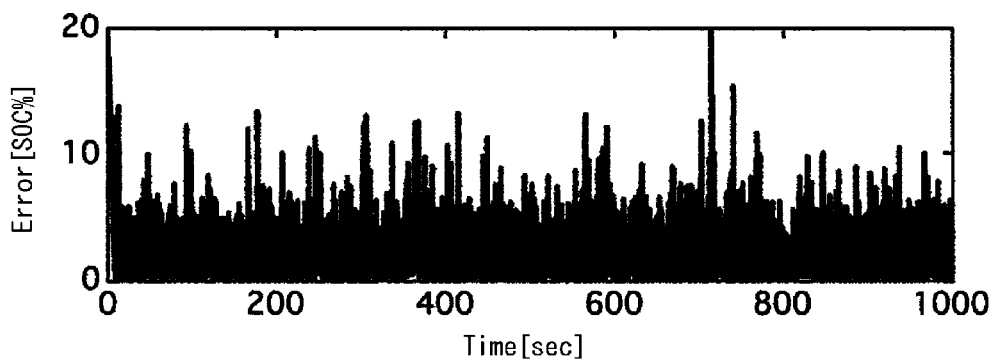
FIG. 9B is a diagram illustrating, in the simulation under the condition 2, an error caused by the estimation using the open circuit voltage method.
Figure 9C:
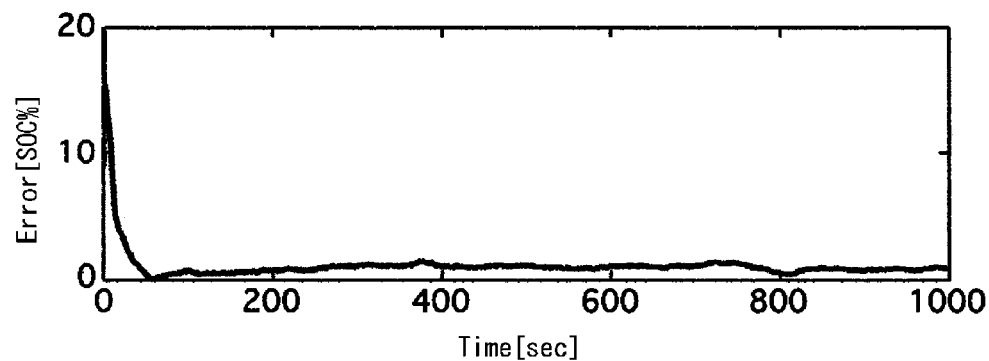
FIG. 9C is a diagram illustrating, in the simulation under the condition 2, an error caused by the estimation using the sensor fusion method.

Results of the estimation of the SOC of the simulation under the condition 2 are illustrated in FIGS. 8A to 8C, and absolute values of errors thereof are respectively illustrated in FIGS. 9A to 9C.

In FIG. 8 and FIG. 9, in a manner similar to FIG. 6 and FIG. 7, horizontal axes represent the time, and the vertical axes represent the SOC and the error by each of the estimation methods.

As can be seen from the results, a divergence of the SOC occurs in the current integration method, and the SOC is accompanied by noise while staying close to the true value in the open circuit voltage method. However, the sensor fusion method, by integrating these results, allows the estimation of the SOC with high accuracy.

Figure 10A:
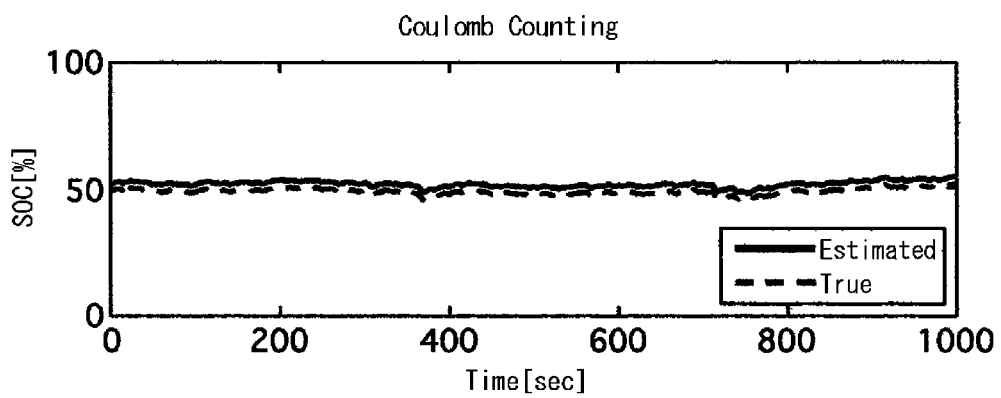
FIG. 10A is a diagram illustrating, in a simulation under a condition 6, a SOC estimated by the current integration method.
Figure 10B:
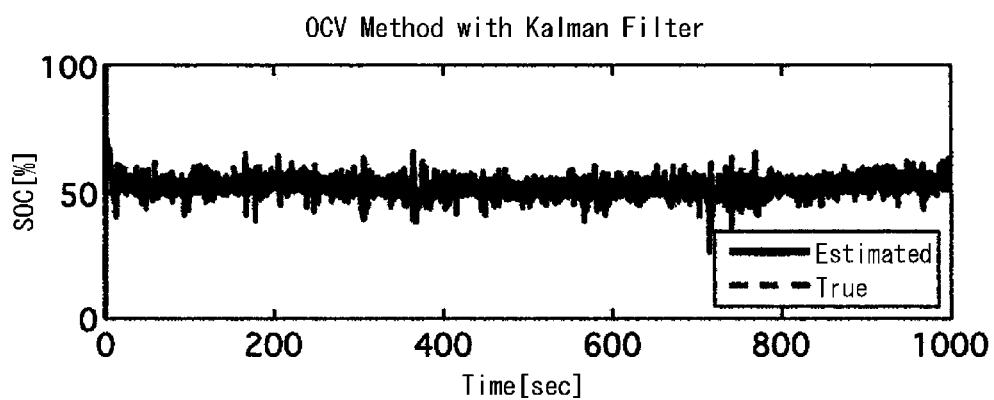
FIG. 10B is a diagram illustrating, in the simulation under the condition 6, a SOC estimated by the open circuit voltage method.
Figure 10C:
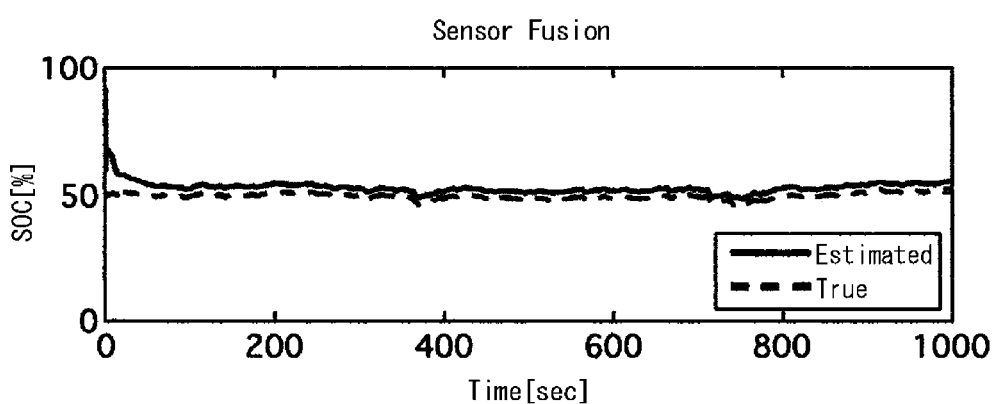
FIG. 10C is a diagram illustrating, in the simulation under the condition 6, a SOC estimated by the sensor fusion method.
Figure 11A:
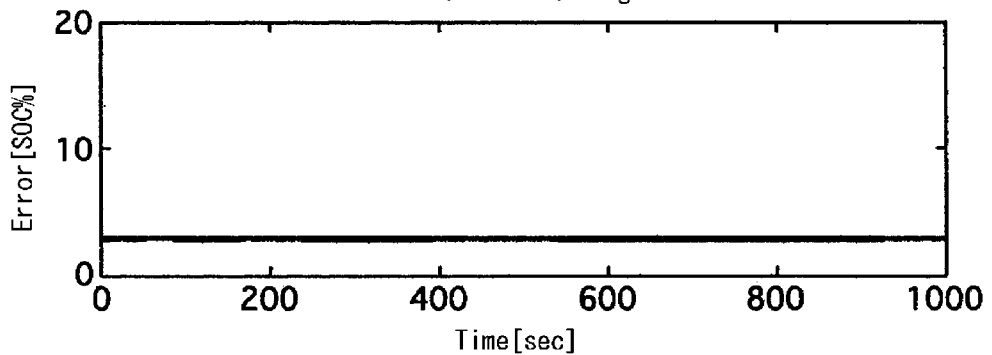
FIG. 11A is a diagram illustrating, in the simulation under the condition 6, an error caused by the estimation using the current integration method.
Figure 11B:
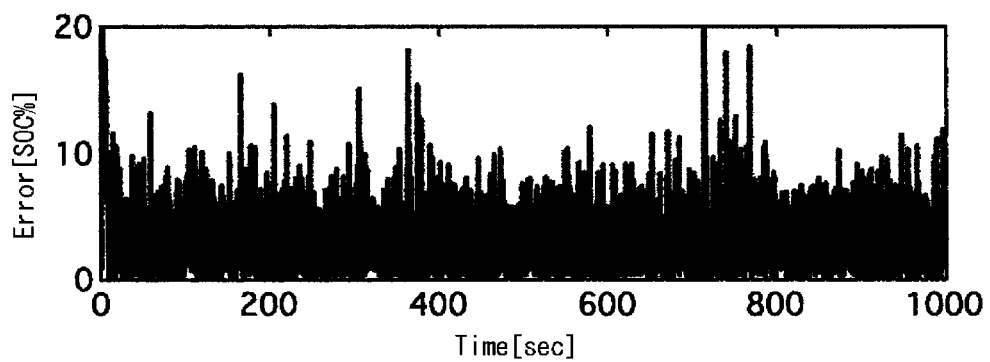
FIG. 11B is a diagram illustrating, in the simulation under the condition 6, an error caused by the estimation using the open circuit voltage method.
Figure 11C:
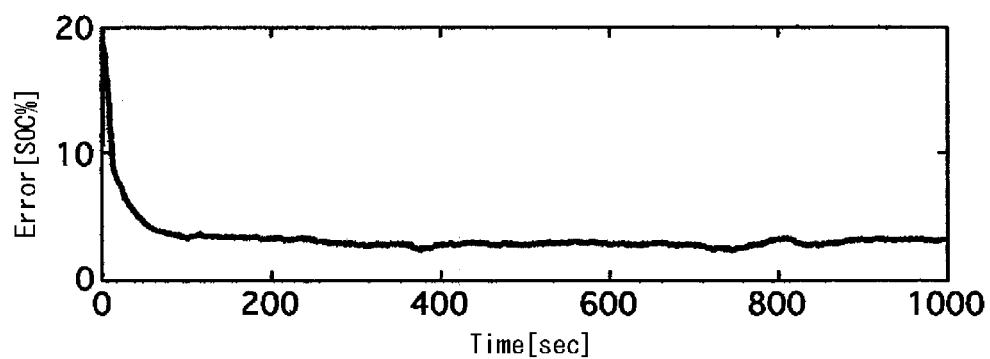
FIG. 11C is a diagram illustrating, in the simulation under the condition 6, an error caused by the estimation using the sensor fusion method.

Results of the estimation of the SOC of the simulation under the condition 6 are illustrated in FIGS. 10A to 10C, and absolute values of errors thereof are respectively illustrated in FIGS. 11A to 11C.

In FIG. 10 and FIG. 11 also, in a manner similar to FIG. 6 and FIG. 7, horizontal axes represent the time, and the vertical axes represent the SOC and the error by each of the estimation methods.

Under this condition, neither one of the methods, while estimating the SOC close to the true value, estimates with high accuracy compared with those under the conditions 1 and 2 described above.

That is, the offset error occurs in the current integration method. This is because, since the initial value is obtained by using the voltage sensor, the offset error of the voltage sensor has an impact thereon. Also, in the open circuit voltage method, similarly to other methods, the estimated SOC contains a great amount of noise. In the sensor fusion method, the offset error at the same level as that of the current integration method occurs after convergence.

However, as will be described below, in this case deterioration of the accuracy of the estimation remains at a level causing no problem in practical use.

In other words, a deterioration in the estimation error under the conditions 6 is caused by the open circuit voltage method. The impact of the offset error of the voltage sensor appears in the form of the offset error of the estimation of the SOC of the open circuit voltage method. Therefore, in combination with the current integration method causing the offset error, no correction will be made.

Under the conditions 1 and 2, since the open circuit voltage method generates the estimation value which contains the noise but has no offset error, the sensor fusion method may be used for correction. According to the present invention, i.e., the present embodiment, since it is assumed that the SOC estimated by the open circuit voltage method originally has the regular whiteness noise alone added thereon, the open circuit voltage method cannot deal with the offset error in addition.

However, as can be seen from the table in FIG. 12 showing results of the estimation of the SOCs under all of the conditions, when the worst value, i.e., the offset error of the voltage sensor of ±40 mV is given, the accuracy of the estimation of the SOC by the open circuit voltage method deteriorates only by about 3%, which is no problem in practical use.

Note that in the table in FIG. 12, for each of the estimation methods, a root mean square error (RMSE: Root Mean Square Error) is summarized from the true value of the SOC. However, in calculation of the RMSE, a time required for convergence of the initial estimated value is taken into account and results of the estimation between 100 seconds and 1,000 seconds alone are used for the calculation.

It can be seen from the table that, even when the accuracy of the SOC of the current integration method is extremely deteriorated, the sensor fusion method may estimate the SOC with high accuracy.

Although the present invention has been illustrated with reference to the embodiment as described above, the present invention is not limited thereto but includes design modifications thereof without departing from the scope of the present invention.

For example, the SOC estimation apparatus according to the present invention is also applicable to, in addition to a hybrid electric vehicle, an electric vehicle and other products using the battery for estimating the SOC.

REFERENCE SIGNS LIST

B battery
1 charge and discharge current detection unit
2 terminal voltage detection unit
3 current integration method SOC estimation unit
4 open circuit voltage method SOC estimation unit
5 subtraction unit (error correction value calculation unit)
6 Kalman filter (error correction value calculation unit)

The invention claimed is:

1. A battery's state of charge estimation apparatus comprising:
a charge and discharge current detection unit for detecting a charge current and a discharge current of a battery;
a terminal voltage detection unit for detecting a terminal voltage of the battery;
a first processing unit for providing an open circuit voltage method state of charge estimate, the first processing unit configured to estimate an open circuit voltage of the battery based on the charge current and the discharge current detected by the charge and discharge current detection unit and the terminal voltage detected by the terminal voltage detection unit, and configured to estimate, based on the open circuit voltage, the open circuit voltage method state of charge from an open circuit voltage-state of charge characteristic of the battery;
a second processing unit for providing a current integration method state of charge, the second processing unit configured to use as a current integration model, a discrete state space model of a spreading system that uses a state variable of the spreading system in consideration of a current fluctuation Δi expressed by the following equation:

$$z = \begin{bmatrix} x \\ u \end{bmatrix}$$

provided that an input u represents the charge and discharge current of the battery, a state variable x represents the battery's state of charge, and an output y represents the state of charge and the charge and discharge current, and is expressed by the following equations:

$$z_{k+1} = \begin{bmatrix} 1 & \dfrac{\Delta t}{FCC} \\ 0 & 1 \end{bmatrix} z_k + \begin{bmatrix} v_k \\ \Delta i \end{bmatrix}$$

$$y_k = \begin{bmatrix} 1 & 0 \\ 0 & 1 \end{bmatrix} z_k + w_k$$

(k: discrete time, Δt: sampling period, FCC: full charge capacity, v: process noise, w: sensor noise), for inputting the charge current and the discharge current detected by the charge and discharge current detection unit and thus obtaining the state of charge as the state variable, and for correcting the state of charge based on an error correction value being further input and thus obtaining the current integration method state of charge; and a third processing unit configured to compare the current integration method state of charge obtained by the second processing unit and the open circuit voltage method state of charge estimated by the first processing unit to calculate an error correction value for correcting the current integration method state of charge, and for inputting the error correction value to the second processing unit.

2. The battery's state of charge estimation apparatus according to claim 1, wherein the third processing unit has Kalman filter and is configured to obtain the error correction value by multiplying a difference between the current integration method state of charge and the open circuit voltage method state of charge by Kalman gain.

* * * * *